(12) United States Patent
Liu et al.

(10) Patent No.: US 12,079,403 B2
(45) Date of Patent: Sep. 3, 2024

(54) SAMPLING A TO-BE-MEASURED SIGNAL BY A STYLUS

(71) Applicant: HUAWEI TECHNOLOGIES CO., LTD., Guangdong (CN)

(72) Inventors: Wujian Liu, Shenzhen (CN); Guang He, Dongguan (CN); Yang Xiang, Wuhan (CN); Deliang Zhang, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/915,038

(22) PCT Filed: Mar. 16, 2021

(86) PCT No.: PCT/CN2021/081010
§ 371 (c)(1),
(2) Date: Sep. 27, 2022

(87) PCT Pub. No.: WO2021/197046
PCT Pub. Date: Oct. 7, 2021

(65) Prior Publication Data
US 2023/0168754 A1    Jun. 1, 2023

(30) Foreign Application Priority Data

Mar. 31, 2020 (CN) .......................... 202010243421.2

(51) Int. Cl.
*G06F 3/038* (2013.01)
*G06F 3/0354* (2013.01)
*G06F 3/041* (2006.01)

(52) U.S. Cl.
CPC ........ *G06F 3/0383* (2013.01); *G06F 3/03545* (2013.01); *G06F 3/04162* (2019.05); *G06F 3/04182* (2019.05); *G06F 2203/0384* (2013.01)

(58) Field of Classification Search
CPC ......... G06F 2203/0384; G06F 3/03545; G06F 3/038; G06F 3/0383; G06F 3/04162; G06F 3/04182; H03M 1/504
See application file for complete search history.

(56) References Cited

U.S. PATENT DOCUMENTS

| | | |
|---|---|---|
| 5,889,820 A | 3/1999 | Adams |
| 2002/0000926 A1 | 1/2002 | Nanba et al. |

(Continued)

FOREIGN PATENT DOCUMENTS

| | | |
|---|---|---|
| CN | 101243638 A | 8/2008 |
| CN | 101247187 A | 8/2008 |

(Continued)

OTHER PUBLICATIONS

Wu et al., "A Low Power Double-Sampling Extended Counting ADC With Class-AB OTA for Sensor Arrays," IEEE Transactions on Circuits and Systems-I: Regular Papers, vol. 62, No. 1, Jan. 2015, 10 pages.

(Continued)

*Primary Examiner* — Chun-Nan Lin
(74) *Attorney, Agent, or Firm* — Fish & Richardson P.C.

(57) ABSTRACT

This application provides a signal decoding method, a decoding circuit, and a stylus. In one example, a to-be-measured signal is sampled to obtain a plurality of sampled signals. The to-be-measured signal is a modulation signal that carries an interference signal. The modulation signal is sent by a touch panel of a terminal device. At least two edge signals in the to-be-measured signal are determined based on the plurality of sampled signals. The to-be-measured signal is decoded based on the at least two edge signals to obtain the modulation signal.

10 Claims, 4 Drawing Sheets

(56) References Cited

U.S. PATENT DOCUMENTS

| | | | |
|---|---|---|---|
| 2003/0197691 A1 | 10/2003 | Fujiwara et al. | |
| 2010/0149168 A1* | 6/2010 | Thomas | G09G 3/3629 345/100 |
| 2012/0250754 A1* | 10/2012 | Heinrich | H03F 3/217 375/238 |
| 2013/0243043 A1* | 9/2013 | Rhee | H04B 1/71632 375/147 |
| 2016/0091992 A1* | 3/2016 | Yilmaz | G06F 3/0442 345/174 |
| 2018/0205319 A1* | 7/2018 | Zhuo | H02M 3/33523 |

FOREIGN PATENT DOCUMENTS

| | | |
|---|---|---|
| CN | 203673444 U | 6/2014 |
| CN | 105281776 A | 1/2016 |
| CN | 105468170 A | 4/2016 |
| CN | 106921463 A | 7/2017 |
| CN | 106950429 A | 7/2017 |
| CN | 109564476 A | 4/2019 |
| CN | 109751043 A | 5/2019 |
| CN | 110308807 A | 10/2019 |
| CN | 110494828 A | 11/2019 |
| EP | 1728217 A1 | 12/2006 |
| KR | 100340727 * 9/1999 ........... G06F 3/0383 |

OTHER PUBLICATIONS

Office Action in Chinese Appln. No. 202010243421.2, dated Mar. 21, 2022, 7 pages (with English translation).

Extended European Search Report in European Appln No. 21780020.0, dated Aug. 21, 2023, 10 pages.

\* cited by examiner

SAMPLING A TO-BE-MEASURED SIGNAL BY A STYLUS

CROSS-REFERENCE TO RELATED APPLICATIONS

This application is a national stage of International Patent Application No. PCT/CN2021/081010, filed on Mar. 16, 2021, which claims priority to Chinese Patent Application No. 202010243421.2, filed on Mar. 31, 2020. Both of the aforementioned applications are hereby incorporated by reference in their entireties.

TECHNICAL FIELD

This application pertains to the field of stylus technologies, and in particular, to a signal decoding method, a decoding circuit, and a stylus.

BACKGROUND

With continuous development of terminal technologies, a terminal device may not only receive, by using a keyboard and a touch panel, information entered by a user, but also obtain, by using a stylus that matches the terminal device, the information entered by the user. When the user writes input information on a screen of the terminal device by using the stylus, the terminal device may display a writing trace of the stylus on the screen.

In a related technology, when a stylus approaches a touch panel (touch panel, TP) of a terminal device, the stylus may detect a modulation signal that carries an interference signal and that is sent by the TP, and decode the modulation signal by using an operational amplifier, a comparator, and a decoding module, to obtain a modulation signal that includes no interference signal, and then send the decoded modulation signal to a processor. If the processor receives the decoded modulation signal and receives a pressure signal sent by a pressure sensor, the processor may control a Bluetooth module to send a response signal including the decoded modulation signal and the pressure signal to the terminal device, so that the terminal device may display a writing trace on the TP based on the response signal.

However, in a process of decoding the modulation signal by using the operational amplifier, the comparator, and the decoding module, a decoding delay may occur due to impact from bandwidth of the comparator and external noise, and consequently, a problem that there is a delay when the writing trace is displayed on the TP of the terminal device is caused.

SUMMARY

Embodiments of this application provide a signal decoding method, a decoding circuit, and a stylus, to resolve a problem that there is a delay when a writing trace is displayed on a TP of a terminal device.

According to a first aspect, an embodiment of this application provides a signal decoding method, applied to a stylus and including:
  sampling a to-be-measured signal based on a preset sampling rate to obtain a plurality of sampled signals, where the to-be-measured signal is a modulation signal that carries an interference signal, and the modulation signal is sent by a touch panel of a terminal device;
  determining at least two edge signals in the to-be-measured signal based on the plurality of sampled signals; and
  decoding the to-be-measured signal based on the at least two edge signals to obtain the modulation signal.

In a first possible implementation of the first aspect, the decoding the to-be-measured signal based on the at least two edge signals to obtain the modulation signal includes:
  determining level duration of the to-be-measured signal based on the at least two edge signals; and
  decoding the to-be-measured signal based on the level duration to obtain the modulation signal.

Based on the first possible implementation of the first aspect, in a second possible implementation of the first aspect, the at least two edge signals include a first edge signal and a second edge signal, and the first edge signal appears earlier than the second edge signal; and
  the determining level duration of the to-be-measured signal based on the at least two edge signals includes:
  if the first edge signal is detected, starting counting by using a counter;
  if the second edge signal is detected, controlling the counter to stop counting; and
  determining the level duration of the to-be-measured signal based on a counting value recorded in the counter, preset bit width time, and the sampling rate.

Based on the second possible implementation of the first aspect, in a third possible implementation of the first aspect, after the controlling the counter to stop counting, the method further includes:
  resetting the counter so that the counter counts again.

In a fourth possible implementation of the first aspect, the determining at least two edge signals in the to-be-measured signal based on the plurality of sampled signals includes:
  determining an amplitude difference between every two adjacent sampled signals based on amplitudes corresponding to the plurality of sampled signals; and
  determining the at least two edge signals in the to-be-measured signal based on the amplitude difference, where an amplitude difference between any two adjacent sampled signals in sampled signals corresponding to the edge signals is greater than an amplitude threshold.

Based on the fourth possible implementation of the first aspect; in a fifth possible implementation of the first aspect, the amplitude threshold is determined based on an amplitude variation amount and a maximum interference amplitude, the amplitude variation amount is used to indicate a maximum amplitude difference between two adjacent sampled signals, the amplitude variation amount is determined based on an amplitude of the modulation signal and the sampling rate, the sampling rate is determined based on edge duration of the edge signal, and the edge duration is used to indicate duration of the edge signal.

According to a second aspect, an embodiment of this application provides a decoding circuit. The decoding circuit includes a decoding module and an amplification module, an input end of the amplification module is connected to a receiver of a stylus, an output end of the amplification module is connected to an input end of the decoding module, and an output end of the decoding module is connected to a processor of the stylus;
  the amplification module is configured to receive and amplify a modulation signal including an interference signal, to obtain a to-be-measured signal; and the decoding module is configured to decode the to-be-measured signal, and send the modulation signal to the processor.

In a first possible implementation of the second aspect, the decoding module includes an analog-to-digital converter, a decoder, and a counter;

an input end of the analog-to-digital converter is connected to the output end of the amplification module, an output end of the analog-to-digital converter is connected to an input end of the decoder, and the analog-to-digital converter is configured to convert an analog signal into a digital signal;

an output end of the decoder is connected to the processor, and the decoder is configured to perform decoding based on the digital signal obtained through conversion to obtain the modulation signal, and send the modulation signal to the processor; and the counter is separately connected to the output end of the decoder and the processor.

According to a third aspect, an embodiment of this application provides a stylus. The stylus includes a receiver, a processor, a pressure sensor, a transmitter, and the decoding circuit according to any implementation of the second aspect; and the receiver is connected to an input end of the decoding circuit, and the processor is separately connected to an output end of the decoding circuit, the pressure sensor, and the transmitter.

According to a fourth aspect, an embodiment of this application provides a computer program product. When the computer program product runs on a stylus, the stylus is enabled to perform the signal decoding method according to any implementation of the first aspect.

Beneficial effects of embodiments of this application compared with a conventional technology are as follows:

In embodiments of this application, the to-be-measured signal is sampled based on the predetermined sampling rate; in other words, the modulation signal that carries the interference signal is sampled, to obtain the plurality of sampled signals; the at least two edge signals in the to-be-measured signal are determined based on the plurality of sampled signals; and then, the to-be-measured signal is decoded based on the at least two edge signals to obtain the modulation signal, so that a writing trace can be displayed on the touch panel of the terminal device based on the modulation signal and a pressure signal that is detected by the stylus. The edge signals in the to-be-measured signal are determined, and a moment at which a level jumps in the to-be-measured signal is determined based on the edge signals. Therefore, it is unnecessary to determine, by using a comparator, whether a level of the to-be-measured signal at each moment is a high level or a low level, so that time required for decoding the to-be-measured signal is reduced, a speed of decoding the to-be-measured signal by the stylus is improved, a delay of displaying the writing trace by the terminal device is effectively reduced, and a speed of displaying the writing trace by the terminal device is improved.

BRIEF DESCRIPTION OF DRAWINGS

To describe the technical solutions in embodiments of this application more clearly, the following briefly describes the accompanying drawings for describing embodiments. It is clear that the accompanying drawings in the following description show merely some embodiments of this application, and a person of ordinary skill in the art may still derive other drawings from these accompanying drawings without creative efforts.

DESCRIPTION OF EMBODIMENTS

In the following description, to illustrate rather than limit, specific details such as a particular system structure, an interface, and a technology are provided to make a thorough understanding of this application. However, a person skilled in the art should know that this application may be practiced in other implementations without these specific details. In other cases, detailed descriptions of well-known apparatuses, circuits, and methods are omitted, so that this application is described without being obscured by unnecessary details.

Terms used in the following embodiments are merely intended to describe specific embodiments, and are not intended to limit this application. As used in the specification and the appended claims of this application, singular expressions "one", "the", "the foregoing", and "this" are intended to also include expressions such as "one or more" unless the contrary is explicitly indicated in context. It should be further understood that, in embodiments of this application, "one or more" means one, two, or more than two, and "and/or" describes an association relationship of associated objects, and indicates that three relationships may exist. For example, A and/or B may represent the following cases: only A exists, both A and B exist, and only B exists, where A and B may be singular numbers or plural numbers. The character "/" generally indicates an "or" relationship between the associated objects.

A signal decoding method provided in embodiments of this application may be applied to a terminal device such as a mobile phone, a tablet computer, a vehicle-mounted device, a notebook computer, an ultra-mobile personal computer (ultra-mobile personal computer, UMPC), a netbook, or a personal digital assistant (personal digital assistant, PDA). A specific type of the terminal device is not limited in embodiments of this application.

Figure 1:
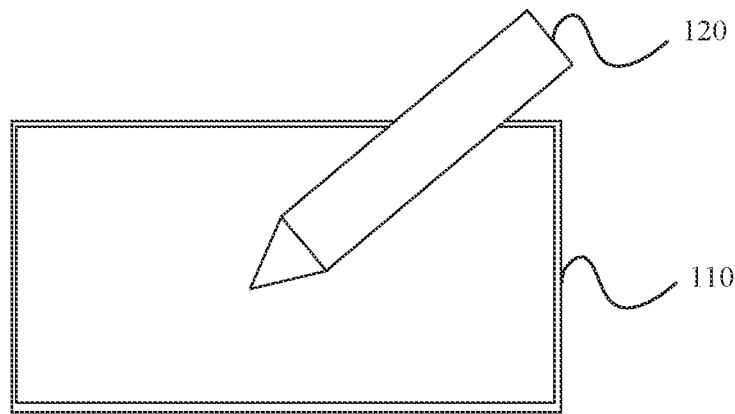
FIG. 1 is a schematic diagram of a scenario involved in a signal decoding method according to an embodiment of this application.

For example, the terminal device may be a station (STATION, ST) in a WLAN, or may be a cellular phone, a cordless phone, a session initiation protocol (Session Initiation Protocol, SIP) phone, a personal digital assistant (Personal Digital Assistant, PDA) device, a handheld device with a wireless communication function, a vehicle-mounted device, an internet of vehicles terminal, a computer, a laptop computer, a handheld communication device, a handheld computing device, or a satellite wireless device, FIG. 1 is a schematic diagram of a scenario involved in a signal decoding method according to an embodiment of this application. As an example instead of a limitation, as shown in FIG. 1, the scenario may include a terminal device 110 and a stylus 120.

The terminal device may include a processor and a TP, and the stylus may include a receiver, a decoding circuit, a processor, a pressure sensor, and a transmitter. In addition, the terminal device may exchange data with the stylus. For example, the stylus may receive a modulation signal sent by the TP of the terminal device, the stylus may also send a response signal to the terminal device, and the terminal device can display, on the TP based on the response signal, a writing trace obtained after the stylus writes on the TP.

In a possible implementation, the TP of the terminal device may send the modulation signal. If the stylus approaches the TP, the stylus may receive, by using the receiver, the modulation signal sent by the TP, and decode the modulation signal by using the decoding circuit, so that an interference signal and noise in the received modulation signal may be filtered out to obtain the modulation signal sent by the TP.

If the pressure sensor of the stylus detects pressure generated when the stylus writes on the TP, the pressure sensor may generate a pressure signal, and the processor of the stylus may generate a response signal with reference to the modulation signal obtained through decoding, and send the response signal to the terminal device by using the transmitter. The terminal device may receive the response signal, and determine a writing position of the stylus on the TP based on the modulation signal that is corresponding to the pressure signal and that is in the response signal, so that the writing trace of the stylus may be displayed on the TP of the terminal device.

Figure 2:
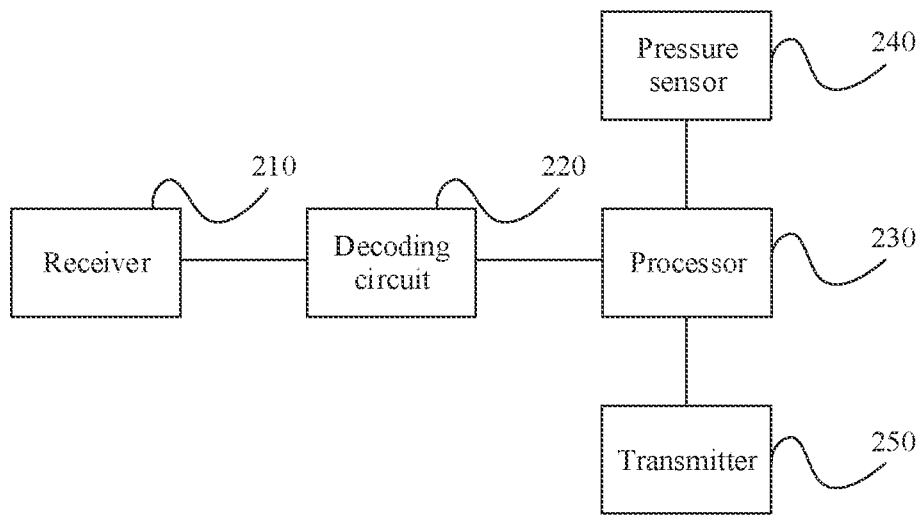
FIG. 2 is a block diagram of a structure of a stylus according to an embodiment of this application.

In addition, FIG. 2 is a block diagram of a structure of a stylus according to an embodiment of this application. The stylus may include a receiver 210, a decoding circuit 220, a processor 230, a pressure sensor 240, and a transmitter 250.

The receiver is connected to an input end of the decoding circuit, and the processor is separately connected to the decoding circuit, the pressure sensor, and the transmitter.

The decoding circuit may receive a to-be-measured signal received and forwarded by the receiver, that is, receive a modulation signal that carries an interference signal, decode the to-be-measured signal to obtain the modulation signal from which the interference signal is removed, and then send, to the processor, the modulation signal from which the interference signal is removed. The processor may determine, based on the modulation signal, a moment at which the stylus approaches a TP of a terminal device and writes on the TP.

The pressure sensor may detect whether the stylus writes on the TP. If the stylus writes on the TP, the pressure sensor may detect pressure on the stylus, to generate a pressure signal, and send the pressure signal to the processor.

After obtaining the modulation signal through decoding, if the processor receives the pressure signal sent by the pressure sensor, the processor may determine that the stylus writes on the TP of the terminal device, and therefore may generate a response signal based on the modulation signal and the pressure signal, and send the response signal to the terminal device. In this way, the terminal device may display, based on the response signal, a writing trace obtained after the stylus writes on the TP.

Figure 3:
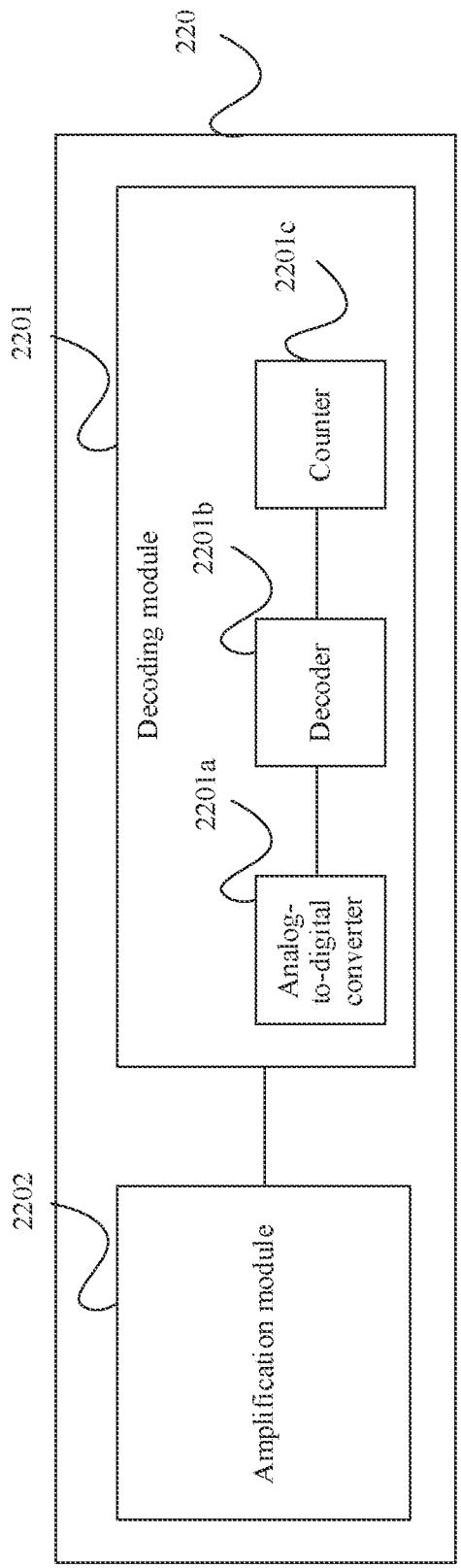
FIG. 3 is a block diagram of a structure of a decoding circuit according to an embodiment of this application.

Further, FIG. 3 is a block diagram of a structure of a decoding circuit according to an embodiment of this application. The decoding circuit may include a decoding module 2201 and an amplification module 2202.

An input end of the amplification module is connected to a receiver, and an output end is connected to an input end of the decoding module, to amplify a received modulation signal that includes an interference signal. For example, the amplification module may be an operational amplifier.

The input end of the decoding module is connected to an output end of the amplification module, and an output end of the decoding module is connected to a processor of a stylus, to decode a to-be-measured signal, obtain a modulation signal through restoration, and send the restored modulation signal to the processor.

As shown in FIG. 3, the decoding module may include an analog-to-digital converter 2201$a$, a decoder 2201$b$, and a counter 2201$c$.

An input end of the analog-to-digital converter is connected to the output end of the amplification module, an output end is connected to an input end of the decoder, and the analog-to-digital converter is configured to convert an analog signal into a digital signal. An output end of the decoder is connected to the processor of the stylus, and the decoder is configured to: decode the digital signal obtained through conversion, obtain the modulation signal through restoration, and send the modulation signal to the processor. The counter may be separately connected to the output end of the decoder and the processor, and is configured to count based on an edge signal identified by the decoder, to help restore the modulation signal based on a calculated counting value.

In conclusion, according to the decoding circuit provided in this embodiment of this application, the to-be-measured signal may be decoded by using the decoding module and the amplification module of the stylus, to obtain, without using a comparator, the modulation signal sent by the TP of the terminal device, so that costs of the decoding circuit are reduced.

Figure 4:
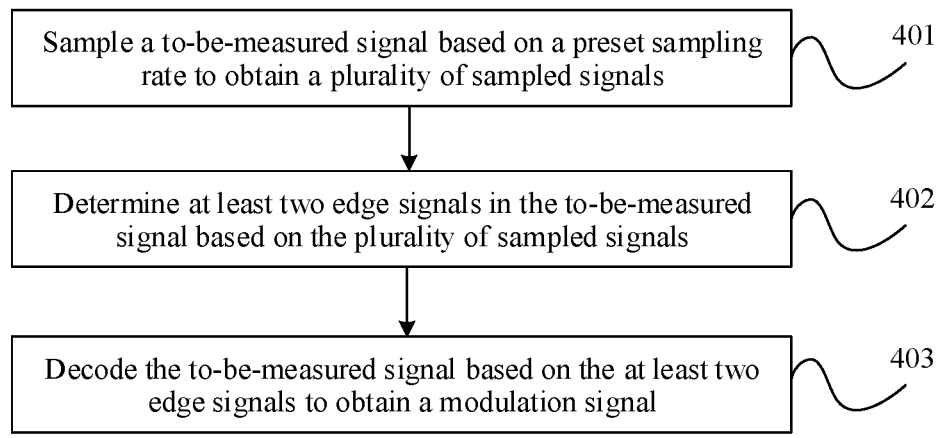
FIG. 4 is a schematic flowchart of a signal decoding method according to an embodiment of this application.

FIG. 4 is a schematic flowchart of a signal decoding method according to an embodiment of this application. As an example instead of a limitation, the method may be applied to the foregoing stylus. As shown in FIG. 4, the method includes the following steps.

Step 401: Sample a to-be-measured signal based on a preset sampling rate to obtain a plurality of sampled signals.

The to-be-measured signal is a modulation signal that carries an interference signal, and the modulation signal is sent by a touch panel of a terminal device.

After receiving the to-be-measured signal, a stylus may sample the to-be-measured signal based on the predetermined sampling rate, and determine an edge signal in the to-be-measured signal based on the sampled signal, so that the to-be-measured signal may be restored based on a plurality of edge signals to obtain a modulation signal from which the interference signal is filtered out.

In a possible implementation, the stylus may first obtain the preset sampling rate, and then sample the to-be-measured signal based on the sampling rate, to obtain the plurality of sampled signals, so that in a subsequent step, the stylus may determine, based on an amplitude difference between two consecutive sampled signals, whether the sampled signals are edge signals.

For example, the preset sampling rate is 360 Hz (hertz). In this case, the stylus may sample the to-be-measured signal 360 times per second, and may obtain 360 sampled signals in each second.

It should be noted that, in actual application, the sampling rate of the stylus is predetermined based on edge duration, so that in a sampling process, the stylus may sample the edge signal at least twice, to determine that the edge signal appears in the modulation signal, avoid omission of the edge signal in the to-be-measured signal, and improve accuracy of the modulation signal obtained through decoding. The edge duration is measured in advance based on the modulation signal sent by the TP of the terminal device, and is used to indicate duration of the edge signal.

For example, if the edge duration of the modulation signal is t, the sampling rate S of the stylus may be greater than or equal to 2/t.

In addition, the sampling rate of the stylus may be determined not only based on the edge duration, but also based on a period of the modulation signal and a proportion of the edge duration in a single period. For example, if the period of the modulation signal is 10 s (second), and the proportion of the edge duration in the single period ranges from 10% to 20%, the edge duration may range from 1 s to 2 s, so that the sampling rate of the stylus may be determined based on a duration range of the edge duration.

In addition, it should be noted that, in actual application, the sampling rate of the stylus is generally preset, but the stylus may provide a key for adjusting the sampling rate. For example, two keys may be set in the stylus, one is a key for improving the sampling rate, and the other is a key for reducing the sampling rate. A manner of determining the sampling rate is not limited in this embodiment of this application.

Step 402: Determine at least two edge signals in the to-be-measured signal based on the plurality of sampled signals.

The stylus may determine, based on amplitudes of the plurality of sampled signals, whether an amplitude variation between any two adjacent sampled signals meets a condition for triggering the edge signal. After traversing every two adjacent sampled signals in the plurality of sampled signals, the edge signal in the to-be-measured signal may be determined.

Optionally, the stylus may determine an amplitude difference between every two adjacent sampled signals based on the amplitudes corresponding to the plurality of sampled signals, and determine the at least two edge signals in the to-be-measured signal based on each amplitude difference. An amplitude difference between any two adjacent sampled signals in the sampled signals corresponding to the edge signals is greater than an amplitude threshold.

In a possible implementation, the stylus may first select two adjacent sampled signals from the plurality of sampled signals, perform calculation based on amplitudes corresponding to the two sampled signals to obtain an amplitude difference between the two sampled signals, and then compare the amplitude difference with the amplitude threshold. If the amplitude difference is less than or equal to the amplitude threshold, it indicates that the amplitude difference between the two sampled signals is relatively small, and no edge signal appears in the to-be-measured signal, and in this case, the stylus may select other two adjacent sampled signals, and obtain an amplitude difference again. If the amplitude difference is greater than the amplitude threshold, it indicates that the amplitude difference between the two sampled signals is relatively large, and it may be determined that the edge signal appears in the to-be-measured signal, and then, the stylus may determine, in the foregoing manner, every two adjacent sampled signals in the plurality of sampled signals, to determine the at least two edge signals in the to-be-measured signal.

Figure 5:
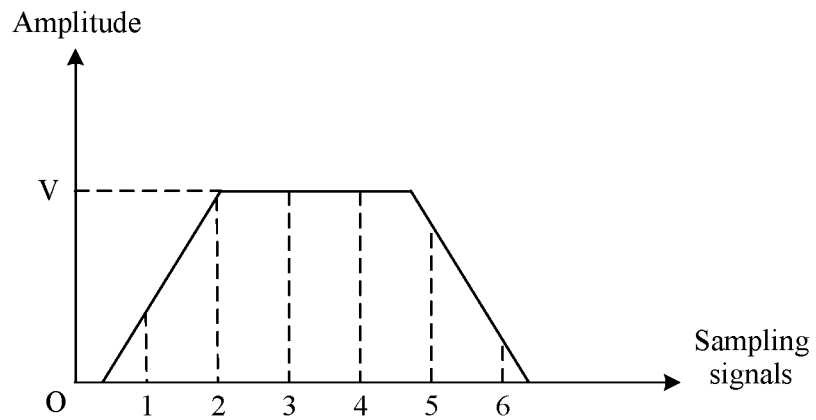
FIG. 5 is a schematic diagram of a to-be-measured signal and a sampled signal according to an embodiment of this application.

For example, FIG. 5 shows a waveform of the to-be-measured signal and an amplitude corresponding to each sampled signal. If the stylus successively collects six sampled signals in a time sequence, the stylus may first select a first sampled signal and a second sampled signal, and calculate an amplitude difference between the first sampled signal and the second sampled signal, and if the amplitude difference is greater than the amplitude threshold, it may be determined that a first edge signal appears. Then, a plurality of groups of sampled signals such as the second sampled signal and a third sampled signal, the third sampled signal and a fourth sampled signal, and the fourth sampled signal and a fifth sampled signal may continue to be determined. If it is determined that an amplitude difference between the fifth sampled signal and a sixth sampled signal is greater than the amplitude threshold, it may be determined that a second edge signal appears.

It should be noted that in actual application, in the sampling process, the stylus may sample a same edge signal for a plurality of times to obtain the plurality of sampled signals, and an amplitude difference between every two adjacent sampled signals in the plurality of sampled signals is greater than the amplitude threshold. In this case, a moment of the edge signal may be determined based on moments of sampled signals corresponding to a plurality of amplitude differences.

For example, a moment of a sampled signal corresponding to a first amplitude difference greater than the amplitude threshold may be used as the moment of the edge signal; a moment of a sampled signal corresponding to a last amplitude difference greater than the amplitude threshold may be used as the moment of the edge signal; or an intermediate-value moment of the moments of the sampled signals corresponding to the plurality of amplitude differences may be selected as the moment of the edge signal.

In addition, it should be noted that the amplitude threshold is determined based on an amplitude variation amount and a maximum interference amplitude, the amplitude variation amount is determined based on an amplitude and a sampling rate that are of a pre-obtained sample modulation signal, the sampling rate is determined based on edge duration of the edge signal, and the edge duration is used to indicate duration of the edge signal.

For example, if edge duration corresponding to an edge signal in the modulation signal sent by the TP of the terminal device is t, the amplitude of the sample modulation signal is V, and the sampling rate that is set in the stylus is S=5/t, a calculated sampling variation amplitude may be $\Delta V1=V/5$. In addition, if a measured maximum interference amplitude is $\Delta V2max$, the calculated amplitude threshold may be $\Delta V=\Delta V1-\Delta V2max$.

Figure 6:
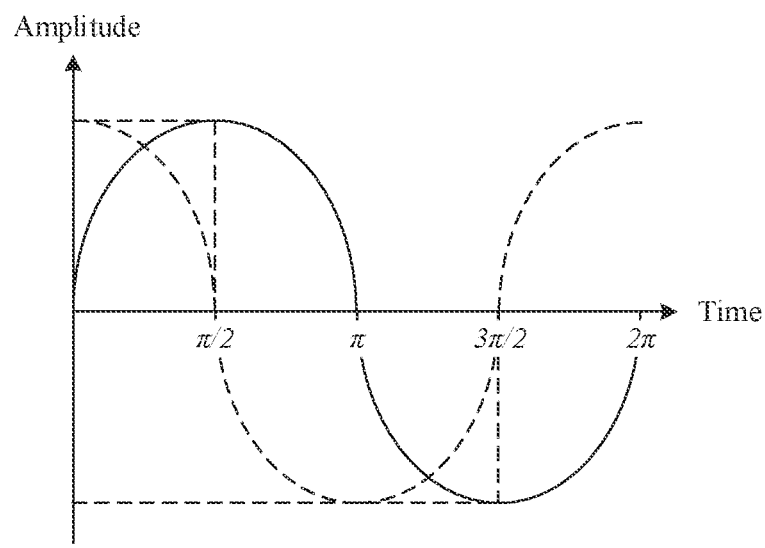
FIG. 6 is a schematic diagram of an interference signal according to an embodiment of this application.

In addition, the maximum interference amplitude is used to indicate a maximum variation amount of an amplitude of the interference signal in the to-be-measured signal. For example, if the interference signal is a sine wave signal, as shown in FIG. 6, in the figure, a solid line is an interference wave signal, and a dashed line is a derivative of the interference wave signal. Because a sine wave signal corresponding to a moment with a largest derivative has a maximum variation rate, and a sine wave signal whose amplitude is 0 corresponds to a maximum derivative, the maximum interference amplitude may be a magnitude variation amount that appears in bit width time in which a moment at which the magnitude of the sine wave signal is 0 is located.

Step 403: Decode the to-be-measured signal based on the at least two edge signals to obtain the modulation signal.

The modulation signal is used to assist the stylus in generating a response signal with reference to a pressure signal, so that the terminal device may display a writing trace of the stylus based on the response signal sent by the stylus. For example, in a process in which the stylus writes on the TP of the terminal device, a pressure sensor in the stylus may detect pressure between the stylus and the TP to form the pressure signal, and the stylus may generate the response signal based on the modulation signal and the pressure signal, and send the response signal to the terminal device, so that the terminal device may display the writing trace of the stylus on the TP.

In a possible implementation, the stylus may determine, based on the at least two edge signals, a sampling position corresponding to each edge signal in the to-be-measured signal, and may determine, based on a time difference between each two edge signals, level duration of the to-be-measured signal, that is, duration in which the to-be-measured signal is at a corresponding level after each jump, so that the to-be-measured signal may be decoded based on the level duration to obtain a modulation signal with no interference signal or noise.

Further, in a process of determining the level duration, in this embodiment of this application, as an example for description, the at least two edge signals include a first edge signal and a second edge signal, and the first edge signal appears earlier than the second edge signal.

Optionally; when detecting the first edge signal, the stylus may enable a counter, and counts duration of a current level of the to-be-measured signal by using the counter. In addition, the stylus may further continue to identify the edge signal. When detecting that the edge signal appears again in the to-be-measured signal, that is, when detecting the second edge signal, the counter may be controlled to stop counting, a counting value obtained after the counter performs counting is obtained, and calculation is performed with reference to a preset bit width and the preset sampling rate, to obtain the level duration of the to-be-measured signal.

For example, if the counting value of the counter is N, the preset bit width time is a, and the preset sampling rate is S, the level duration of the to-be-measured signal may be t'=N/as.

It should be noted that, in actual application, the amplitude of the to-be-measured signal jumps a plurality of times between a high level and a low level; in other words, a plurality of edge signals may be identified. When the controller stops counting, it indicates that the stylus detects the edge signal again, and may reset the counter, so that the counter may perform counting again. In this way, the level duration of the to-be-measured signal may continue to be determined when the edge signal is detected again.

For example, after detecting the first edge signal in a second, and detecting the second edge signal again in a seventh second, the stylus may control the counter to stop counting, and reset the counter, so that the counting value in the counter is set to 0, and then the counter is controlled to start counting again. When the edge signal is detected again, the counter is restarted, and the foregoing process is cycled until the to-be-measured signal is decoded.

In conclusion, in the signal decoding method provided in this embodiment of this application, the to-be-measured signal is sampled based on the predetermined sampling rate; in other words, the modulation signal that carries the interference signal is sampled to obtain the plurality of sampled signals; the at least two edge signals in the to-be-measured signal are determined based on the plurality of sampled signals; and then, the to-be-measured signal is decoded based on the at least two edge signals to obtain the modulation signal, so that the writing trace can be displayed on the touch panel of the terminal device based on the modulation signal and the pressure signal that is detected by the stylus. The edge signals in the to-be-measured signal are determined, and a moment at which a level jumps in the to-be-measured signal is determined based on the edge signals. Therefore, it is unnecessary to determine, by using a comparator, whether a level of the to-be-measured signal at each moment is a high level or a low level, so that time required for decoding the to-be-measured signal is reduced, a speed of decoding the to-be-measured signal by the stylus is improved, a delay of displaying the writing trace by the terminal device is effectively reduced, and a speed of displaying the writing trace by the terminal device is improved.

In addition, in actual application, amplitude values of modulation signals sent by TPs of different terminal devices are inconsistent, and a threshold of a comparator in the stylus is fixed. When the stylus adapts to different terminal devices, a compatibility problem may occur, and consequently, the stylus cannot decode the modulation signal sent by the TP, or a decoding effect is poor. However, in this embodiment of this application, a moment at which the level in the to-be-measured signal jumps is determined based on the identified edge signal, so that the modulation signal can be obtained through decoding, the stylus does not need to totally match the terminal device, and a compatibility problem that may occur when the stylus adapts to different terminal devices is resolved.

In addition, in the signal decoding method provided in this embodiment of this application, in a scenario in which the interference signal is serious (for example, a charging scenario or a call scenario), the modulation signal sent by the TP of the terminal device can still be decoded, so that an anti-interference capability during decoding of the to-be-measured signal is improved.

It should be understood that sequence numbers of the foregoing processes do not mean execution sequences in various embodiments. The execution sequences of the processes should be determined according to functions and internal logic of the processes, and should not be construed as any limitation on the implementation processes of embodiments of this application.

It may be clearly understood by a person skilled in the art that, for the purpose of convenient and brief description, division of the foregoing functional modules is used as an example for illustration. In actual application, the foregoing functions can be allocated to different functional modules and implemented according to a requirement, that is, an inner structure of an apparatus is divided into different functional modules to implement all or some of the functions described above. Each functional unit or module in the embodiments may be integrated into one processing unit, or each unit may exist alone physically, or two or more units are integrated into one unit. The integrated unit may be implemented in a form of hardware, or may be implemented in a form of a software functional unit. In addition, specific names of the functional units and modules are also used for ease of mutual distinction, and are not used to limit the protection scope of this application. For specific working processes of the unit and the module in the foregoing system, refer to corresponding processes in the foregoing method embodiments. Details are not described herein again.

In the foregoing embodiments, the description of each embodiment has respective focuses. For a part that is not described in detail in an embodiment, refer to related descriptions in other embodiments.

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

In embodiments provided in this application, it should be understood that the disclosed apparatus and method may be implemented in other manners. For example, the described device embodiment is merely an example. For example, the module and division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in embodiments of this application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, in this application, all or some of the procedures in the methods in the foregoing embodiments may be implemented by a computer program instructing related hardware. The computer program may be stored in a computer-readable storage medium. When being executed by a processor, steps in the foregoing method embodiments may be implemented. The computer program includes computer program code, and the computer program code may be in a source code form, an object code form an executable file, some intermediate forms, or the like. The computer-readable medium may include at least any entity or apparatus capable of adding computer program code to a stylus, a recording medium, a computer memory, a read-only memory (ROM, Read-Only Memory), a random access memory (RAM, Random Access Memory), an electrical carrier signal, a telecommunications signal, and a software distribution medium, for example, a USB flash drive, a removable hard disk, a magnetic disk, or an optical disc. In some jurisdictions, according to legislation and patent practice, the computer-readable medium cannot be an electrical carrier signal or a telecommunications signal.

The foregoing, embodiments are merely intended for describing the technical solutions of this application other than limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of embodiments of this application, and these modifications or replacements shall fall within the protection scope of this application.

What is claimed is:

1. A signal decoding method, comprising:
    sampling a to-be-measured signal based on a preset sampling rate to obtain a plurality of sampled signals, wherein the to-be-measured signal is a modulation signal that carries an interference signal, and the modulation signal is sent by a touch panel of a terminal device;
    determining at least two edge signals in the to-be-measured signal based at least on amplitudes corresponding to the plurality of sampled signals; and
    decoding the to-be-measured signal based on the at least two edge signals to obtain the modulation signal, wherein the decoding the to-be-measured signal based on the at least two edge signals to obtain the modulation signal comprises:
        determining level duration of the to-be-measured signal based on the at least two edge signals; and
        decoding the to-be-measured signal based on the level duration to obtain the modulation signal.

2. The signal decoding method according to claim 1, wherein the at least two edge signals comprise a first edge signal and a second edge signal, and the first edge signal appears earlier than the second edge signal; and
    the determining level duration of the to-be-measured signal based on the at least two edge signals comprises:
        if the first edge signal is detected, starting counting by using a counter;
        if the second edge signal is detected, controlling the counter to stop counting; and
        determining the level duration of the to-be-measured signal based on a counting value recorded in the counter, preset bit width time, and the sampling rate.

3. The signal decoding method according to claim 2, wherein after the controlling the counter to stop counting, the method further comprises:
    resetting the counter so that the counter counts again.

4. The signal decoding method according to claim 1, wherein the determining at least two edge signals in the to-be-measured signal based at least on amplitudes corresponding to the plurality of sampled signals comprises:
    determining an amplitude difference between every two adjacent sampled signals based on the amplitudes corresponding to the plurality of sampled signals; and
    determining the at least two edge signals in the to-be-measured signal based on the amplitude difference, wherein an amplitude difference between any two adjacent sampled signals in sampled signals corresponding to the edge signals is greater than an amplitude threshold.

5. The signal decoding method according to claim 4, wherein the amplitude threshold is determined based on an amplitude variation amount and a maximum interference amplitude, the amplitude variation amount is determined based on an amplitude of a pre-obtained sample modulation signal and the sampling rate, the sampling rate is determined based on edge duration of the edge signal, and the edge duration is used to indicate duration of the edge signal.

6. A signal decoding method, comprising:
sampling a to-be-measured signal based on a preset sampling rate to obtain a plurality of sampled signals, wherein the to-be-measured signal is a modulation signal that carries an interference signal, and the modulation signal is sent by a touch panel of a terminal device;
determining at least two edge signals in the to-be-measured signal based at least on amplitudes corresponding to the plurality of sampled signals, wherein the determining at least two edge signals in the to-be-measured signal based at least on amplitudes corresponding to the plurality of sampled signals comprises:
   determining an amplitude difference between every two adjacent sampled signals based on the amplitudes corresponding to the plurality of sampled signals; and
   determining the at least two edge signals in the to-be-measured signal based on the amplitude difference, wherein an amplitude difference between any two adjacent sampled signals in sampled signals corresponding to the edge signals is greater than an amplitude threshold; and
decoding the to-be-measured signal based on the at least two edge signals to obtain the modulation signal.

7. The signal decoding method according to claim 6, wherein the decoding the to-be-measured signal based on the at least two edge signals to obtain the modulation signal comprises:
determining level duration of the to-be-measured signal based on the at least two edge signals; and
decoding the to-be-measured signal based on the level duration to obtain the modulation signal.

8. The signal decoding method according to claim 7, wherein the at least two edge signals comprise a first edge signal and a second edge signal, and the first edge signal appears earlier than the second edge signal; and
the determining level duration of the to-be-measured signal based on the at least two edge signals comprises:
   if the first edge signal is detected, starting counting by using a counter;
   if the second edge signal is detected, controlling the counter to stop counting; and
   determining the level duration of the to-be-measured signal based on a counting value recorded in the counter, preset bit width time, and the sampling rate.

9. The signal decoding method according to claim 8, wherein after the controlling the counter to stop counting, the method further comprises:
resetting the counter so that the counter counts again.

10. The signal decoding method according to claim 9, wherein the amplitude threshold is determined based on an amplitude variation amount and a maximum interference amplitude, the amplitude variation amount is determined based on an amplitude of a pre-obtained sample modulation signal and the sampling rate, the sampling rate is determined based on edge duration of the edge signal, and the edge duration is used to indicate duration of the edge signal.

* * * * *